United States Patent
Lee

(10) Patent No.: US 8,436,689 B2
(45) Date of Patent: May 7, 2013

(54) MULTIPLE PHASE VOLTAGE CONTROLLED OSCILLATOR INCLUDING A RESONANT CIRCUIT AND NEGATIVE RESISTANCE CIRCUIT

(75) Inventor: Young Jae Lee, Daegu (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 31 days.

(21) Appl. No.: 12/959,058

(22) Filed: Dec. 2, 2010

(65) Prior Publication Data

US 2011/0148535 A1 Jun. 23, 2011

(30) Foreign Application Priority Data

Dec. 21, 2009 (KR) .................. 10-2009-0128036

(51) Int. Cl.
H03B 5/12 (2006.01)
H03B 27/00 (2006.01)
H03C 3/20 (2006.01)

(52) U.S. Cl.
USPC .................... 331/117 FE; 331/45; 331/117 V

(58) Field of Classification Search ................ 331/36 C, 331/45, 46, 117 FE, 117 R, 167, 177 V
See application file for complete search history.

(56) References Cited

U.S. PATENT DOCUMENTS

| | | | |
|---|---|---|---|
| 6,639,481 B1 * | 10/2003 | Ravi et al. | 331/177 V |
| 6,911,870 B2 | 6/2005 | Gierkink et al. | |
| 7,145,409 B2 | 12/2006 | Lee et al. | |
| 7,362,192 B1 * | 4/2008 | Lin et al. | 331/117 FE |
| 7,420,429 B2 * | 9/2008 | Cha et al. | 331/46 |
| 7,532,001 B2 * | 5/2009 | Lee et al. | 324/127 |
| 7,551,038 B2 * | 6/2009 | Jang et al. | 331/45 |
| 7,557,668 B2 * | 7/2009 | Jang et al. | 331/167 |
| 7,679,465 B2 * | 3/2010 | Aspemyr et al. | 331/117 FE |
| 8,018,292 B2 * | 9/2011 | Wachi et al. | 331/117 R |
| 8,212,625 B2 * | 7/2012 | Lee et al. | 331/117 FE |
| 2006/0181356 A1 | 8/2006 | Park et al. | |

FOREIGN PATENT DOCUMENTS

KR 2007-0042135 A 4/2007
WO WO-2009/104839 * 8/2009

OTHER PUBLICATIONS

Alan W. L. Ng et al., "A 1-V 17-GHz 5-mW CMOS Quadrature VCO Based on Transformer Coupling", IEEE Journal of Solid-State Circuits, vol. 42, No. 9, pp. 1933-1941, Sep. 2007.
Hsien-Ku Chen et al., "A Low Phase-Noise 9-GHz CMOS Quadrature-VCO using Novel Source-Follower Coupling Technique", IEEE RFIC, pp. 851-854.
Youngjae Lee et al., "Current Reuse Cross-Coupling CMOS VCO Using the Center-Tapped Transformer in LC Tank for Digitally Controlled Oscillator" IEEE Radio Frequency Integrated Circuits Symposium, 2008, pp. 549-552.

* cited by examiner

Primary Examiner — Levi Gannon
(74) Attorney, Agent, or Firm — Rabin & Berdo, P.C.

(57) ABSTRACT

A voltage controlled oscillator includes a resonant circuit including one or more transformers and a plurality of variable capacitor circuits connected in parallel to the one or more transformers and generating a plurality of oscillation signals having multiple phases, and a negative resistance circuit including a plurality of transistors cross-coupled via the one or more transformers and generating negative resistance for maintaining the oscillation of the resonant circuit.

9 Claims, 7 Drawing Sheets

$g_{active} = g_n + g_p$

MULTIPLE PHASE VOLTAGE CONTROLLED OSCILLATOR INCLUDING A RESONANT CIRCUIT AND NEGATIVE RESISTANCE CIRCUIT

CROSS-REFERENCE TO RELATED APPLICATIONS

This application claims the priority of Korean Patent Application No. 10-2009-0128036 filed on Dec. 21, 2009, in the Korean Intellectual Property Office, the disclosure of which is incorporated herein by reference.

BACKGROUND OF THE INVENTION

1. Field of the Invention

The present invention relates to a voltage controlled oscillator, and more particularly, to technology for designing a multi-phase multi-band voltage controlled oscillator using transformer coupling which may be used in an IC or the like using CMOS technology.

2. Description of the Related Art

When a voltage controlled oscillator is designed according to the related art, inductors are used as the inductance components of an LC tank.

When a quadrature-phase oscillator having four phases is designed so as to increase the number of oscillation phases, two differential oscillators generating two phase signals may be connected so as to have four phases.

In this case, an occupied area and power consumption may increase, and the performance of the oscillator may be degraded by substrate coupling.

To reduce the impact of substrate coupling, a method using a back gate has been proposed. However, the method has a disadvantage in that the magnitude of generated signals is not sufficiently large. Furthermore, when two oscillators are used as described above, the occupied area and power consumption may increase two-fold. Such a problem is not easy to solve.

In the case of an existing voltage controlled oscillator using transformers, great effort has been made to improve the performance of an LC tank and reduce power consumption through coupling. However, since the number of transformers used therein is not accordingly reduced, there is a limit to reducing the occupied area.

FIGS. 1A and 1B are block diagrams illustrating a state in which two differential oscillators are cross-coupled to thereby obtain a quadrature-phase voltage controlled oscillator according to the related art.

Referring to FIGS. 1A and 1B, two differential oscillators are cross-coupled in such a manner that four oscillation nodes have a 90-degree phase difference from each other.

Referring to FIG. 1A, an oscillator core 11 includes an LC tank and coupling transistors $M_{1c}$ and $M_{2c}$. The LC tank includes NMOS transistors M1 and M2, inductors L, and varactor diodes C. The coupling transistors $M_{1c}$ and $M_{2c}$ are required for connecting two oscillator cores 11 to each other. Through the above-described configuration, the oscillator core 11 has four ports $V_{i+}$, $V_{i-}$, $V_{o+}$, and $V_{o-}$. The two oscillator cores 11 having four ports are cross-coupled in such a manner that the respective oscillation nodes have a 90-degree phase difference from each other. An oscillation signal may be varied by a control voltage $V_{con}$, and bias current may be controlled by a bias voltage $V_{bias}$.

The quadrature-phase voltage controlled oscillator of FIG. 1A has disadvantages in that the coupling transistors may increase the current and a substrate noise effect. To overcome such disadvantages, the quadrature-phase voltage controlled oscillator of FIG. 1B adopts a circuit structure using a back gate instead of the coupling transistors.

Referring to FIG. 1B, an oscillator core 22 includes an LC tank, back-gate resistors Rb and capacitors Cb. The LC tank includes NMOS transistors M1 and M2, inductors L, and varactor diodes C. The back-gate resistors Rb and capacitors Cb are required for connecting two oscillator cores 22 to each other. Through the above-described configuration, the oscillator core 22 has four ports $V_{i+}$, $V_{i-}$, $V_{o+}$, and $V_{o-}$. The two oscillator cores 22 having four ports are cross-coupled in such a manner that the respective oscillation nodes have a 90-degree phase difference from each other. An oscillation signal may be varied by a control voltage $V_{con}$, and bias current may be controlled by a bias voltage $V_{bias}$.

The above-described structure is frequently used for implementing a quadrature-phase voltage controlled oscillator. However, since two differential oscillators using the LC tank including inductors or transformers, varactor diodes, and varactor banks are required, the occupied area and the power consumption inevitably increase.

In a wireless communications field, there have been many advances in digital RF transceivers as well as in existing analog transceivers. Furthermore, software defined radio (SDR) transceivers have been recently developed. The current trend is for such transceivers to support multiple bands and multiple modes.

In order to implement such a structure, a reconfigurable circuit which operates smoothly should be provided. When such a structure is implemented, there are technical difficulties in designing a voltage controlled oscillator in a frequency synthesizer such that the voltage controlled oscillator can cover all frequency domains. Several voltage controlled oscillators may be used for each frequency. In this case, however, the occupied area and the power consumption inevitably increase.

Most transceivers which are currently used require in-phase and quadrature phases (I/Q). In order to generate the in-phase and quadrature phases, a method using a divider is frequently used. However, the method has a disadvantage in that there are difficulties in designing the divider operating at a high frequency as the frequency increases. In this case, an oscillator designed to have quadrature phases may be applied, without using the divider.

Therefore, a multi-phase multi-band voltage controlled oscillator which has a small area and operates at low power may be usefully applied to an RF transceiver supporting multiple bands and multiple modes.

A low-power quadrature oscillator may be designed by using transformer coupling. However, since there is a disadvantage in that the occupied area is not reduced, the quadrature oscillator needs to be configured so as to have four ports oscillating in one transformer. Such a method makes it possible to design a quadrature oscillator having a small area.

SUMMARY OF THE INVENTION

An aspect of the present invention provides a structure which is capable of obtaining four quadrature phases through one transformer by using transformer coupling and a current reuse structure and a voltage controlled oscillator which is capable of obtaining four or more phases by extending the structure.

Another aspect of the present invention provides a voltage controlled oscillator in which transistor switches are connected to center taps of transformers and the inductances of the transformers are controlled depending on on/off operations of the switches to vary an oscillation frequency band such that the voltage controlled oscillator operates within a wide band.

According to an aspect of the present invention, there is provided a voltage controlled oscillator including: a resonant circuit including one or more transformers and a plurality of variable capacitor circuits connected in parallel to the one or more transformers and generating a plurality of oscillation signals having multiple phases; and a negative resistance circuit including a plurality of transistors cross-coupled via the one or more transformers and generating negative resistance for maintaining the oscillation of the resonant circuit.

Each of the variable capacitor circuits may include one or more varactor diodes in which capacitances are varied by a control voltage.

Each of the transformers may include primary and secondary coils of which center taps are connected to each other.

The resonant circuit may include one transformer and two variable capacitor circuits connected in parallel to the one transformer and generate four oscillation signals having a 90-degree phase difference. The negative resistance circuit may include: a first transistor connected between one end of the primary coil and a bias current input node and turned on or off in response to a signal applied to one end of the secondary coil; a second transistor connected between the other end of the secondary coil and the bias current input node and turned on or off in response to a signal applied to the other end of the primary coil; a third transistor connected between a power supply voltage input node and the other end of the primary coil and turned on or off in response to a signal applied to the other end of the secondary coil; and a fourth transistor connected between the power supply voltage input node and the one end of the secondary coil and turned on or off in response to a signal to the one end of the primary coil.

The resonant circuit may include (n/2−1) transformers (where n is a multiple of 2 which is equal to or greater than 6) and n/2 variable capacitor circuits connected in parallel to the (n/2−1) transformers and generate n oscillation signals having a phase difference of 2π/n. The negative resistance circuit includes: a first transistor connected between one end of the primary coil of one transformer among the (n/2−1) transformers and a bias current input node and turned on or off in response to a signal applied to one end of the secondary coil of one transformer among the other (n/2−2) transformers; a second transistor connected between one end of the secondary coil of the one transformer among the (n/2−1) transformers and the bias current input node and turned on or off in response to a signal to one end of the primary coil of the one transformer among the other (n/2−2) transformers; a third transistor connected between a power supply voltage terminal and the one end of the primary coil of the one transformer among the other (n/2−2) transformers and turned on or off in response to a signal applied to the one end of the secondary coil of the one transformer among the (n/2−1) transformers; and a fourth transistor connected between the power supply voltage terminal and the one end of the secondary coil of the one transformer among the other (n/2−2) transformers and turned on or off in response to a signal applied to the one end of the primary coil of the one transformer among the (n/2−1) transformers.

The negative resistance circuit may further include: fifth and sixth transistors connected between a center tap of the one transformer among the (n/2−1) transformers and the bias current input node and turned on or off in response to a signal applied to a center tap of the one transformer among the other (n/2−2) transformers; and seventh and eighth transistors connected between the power supply voltage terminal and the center tap of the one transformer among the other (n/2−2) transformers and turned on or off in response to a signal applied to the center tap of the one transformer among the (n/2−1) transformers.

Each of the (n/2−1) transformers may include a plurality of center taps connected to the first and second primary coils and may be divided into a plurality of inductances. The resonant circuit may further include a plurality of switches connecting the center taps of the same transformer and the center taps between different transformers, respectively.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1A:
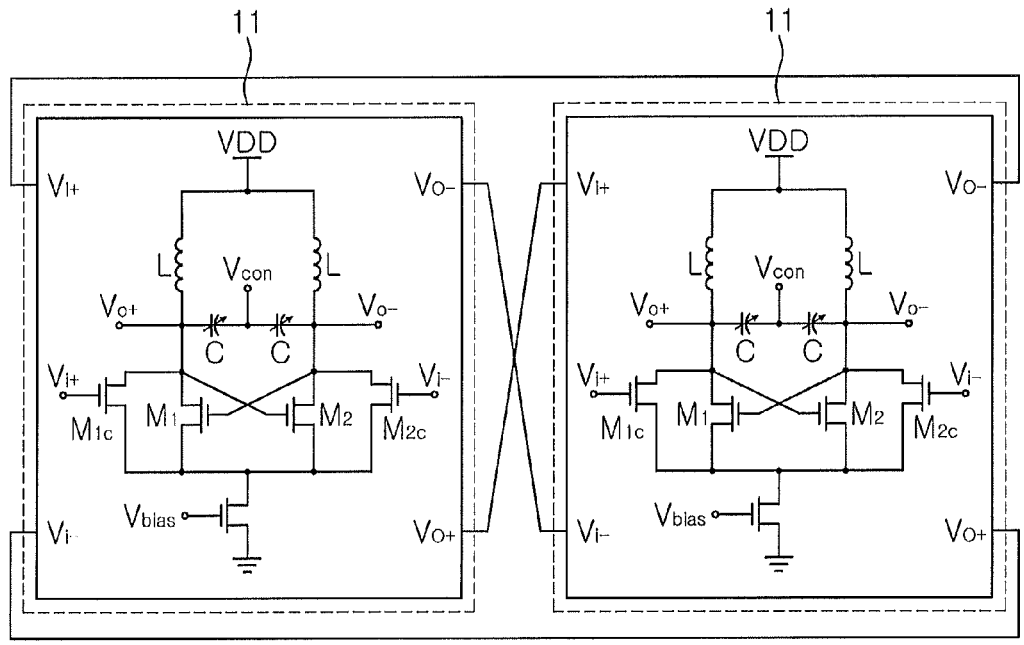
FIGS. 1A and 1B are block diagrams illustrating a state in which two differential oscillators are cross-coupled to obtain a quadrature-phase voltage controlled oscillator according to the related art.
Figure 1B:
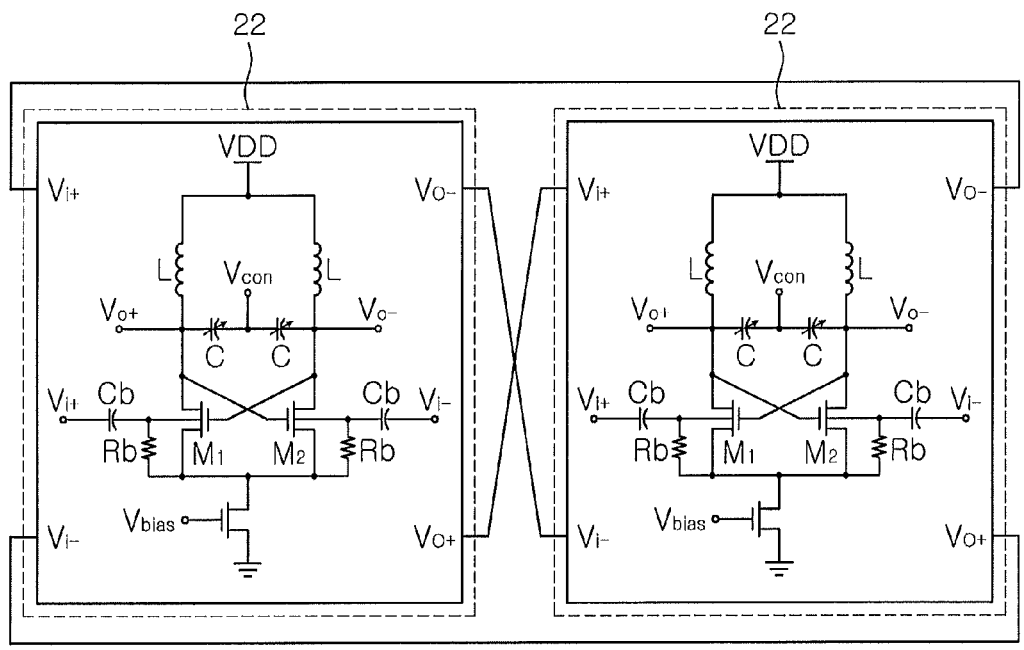

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

Furthermore, when it is described that one component 'includes' another component, it may be understood to mean that the one component does not exclude a different component, but may include the different component.

Figure 2:
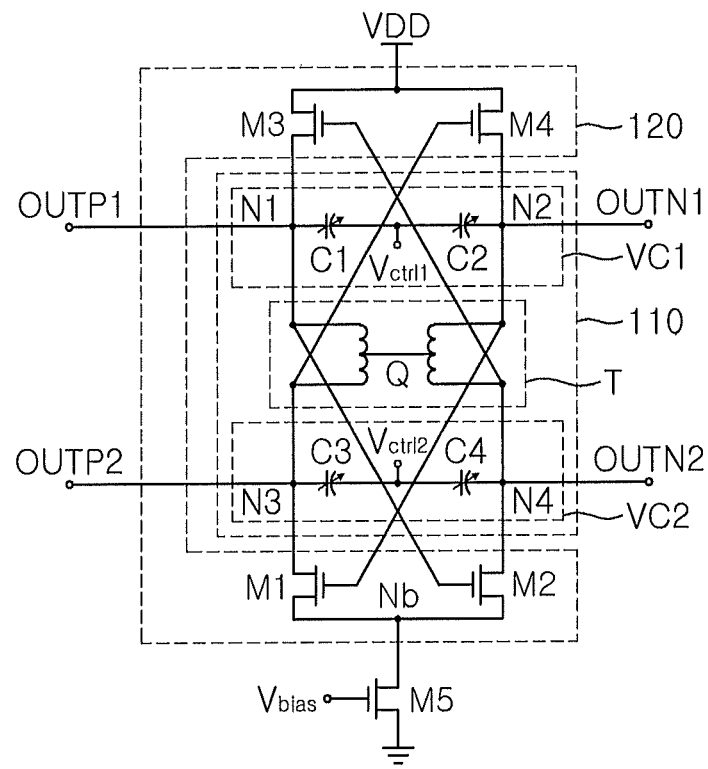
FIG. 2 is a diagram illustrating a voltage controlled oscillator according to a first embodiment of the present invention.

FIG. 2 is a diagram illustrating a voltage controlled oscillator according to a first embodiment of the present invention.

Referring to FIG. 2, the voltage controlled oscillator according to the first embodiment of the present invention includes a resonant circuit 110 and a negative resistance circuit 120. The resonant circuit 110 includes one transformer T and two variable capacitor circuits VC1 and VC2 connected in parallel to the transformer T, and generates four oscillation signals to output to four oscillation nodes N1 to N4. The negative resistance circuit 120 includes four transistors M1 to M4 cross-coupled via the transformer T, and generates negative resistance for maintaining the oscillation of the resonant circuit 110. The voltage controlled oscillator configured in such a manner oscillates at four oscillation signals.

The connection relationship between the respective components will be described in more detail as follows.

The transformer T includes a primary coil connected to the first and third oscillation nodes N1 and N3 and a secondary coil connected to the second and fourth oscillation nodes N2 and N4. The center taps Q of the primary and secondary coils are connected to each other so as to perform DC bias setting and AC signal coupling.

The first variable capacitor circuit VC1 includes a first varactor diode C1 connected between the first oscillation node N1 and a first control voltage $V_{ctrl1}$ and a second varactor diode C2 connected between the first control voltage $V_{ctrl1}$ and the second oscillation node N2. The second variable capacitor circuit VC2 includes a third varactor diode C3 connected between the third oscillation node N3 and a second control voltage $V_{ctrl2}$ and a fourth varactor diode C4 connected between the second control voltage $V_{ctrl2}$ and the fourth oscillation node N4. At this time, the first to fourth varactor diodes C1 to C4 may vary the oscillation signals through variations in capacitance, depending on the first and second control voltages $C_{ctrl1}$ and $V_{ctrl2}$.

The first transistor M1 of the negative resistance circuit 120 is connected between one end N3 of the primary coil and a bias current input node Nb and turned on or off in response to a signal applied to one end N2 of the secondary coil. The second transistor M2 is connected between the other end N4 of the secondary coil and the bias current input node Nb and turned on or off in response to a signal applied to the other end N1 of the primary coil. The third transistor M3 is connected between a power supply voltage input node VDD and the other end N1 of the primary coil and turned on or off in response to a signal applied to the other end N4 of the secondary coil. The fourth transistor M4 is connected between the power supply voltage input node VDD and the one end N2 of the secondary coil and turned on or off in response to a signal applied to the one end N3 of the primary coil. That is, the first and second transistors M1 and M2 and the third and fourth transistors M3 and M4 are respectively cross-coupled via the transformer T, and generate the negative resistance for maintaining the oscillation of the oscillation signals applied to the first to fourth oscillation node N1 to N4.

A bias current applied to the bias current input node Nb may be generated by a fifth transistor M5 having a drain commonly-connected to the sources of the third and fourth transistors M3 and M4, a gate receiving a bias voltage $V_{bias}$, and a source connected to a ground terminal.

The voltage controlled oscillator configured in such a manner varies the control voltages $V_{ctrl1}$ and $V_{ctrl2}$ applied to the first to fourth varactor diodes C1 to C4 to vary the capacitances of the first to fourth varactor diodes C1 to C4, and the transformer T performs a resonant operation with the first to fourth varactor diodes C1 to C4 having the varied capacitances and generates four oscillation signals to output to the first to fourth oscillation nodes N1 to N4. The first and second transistors M1 and M2 amplify and output the oscillation signals applied to the first and third oscillation nodes N1 and N3, and the third and fourth transistors M3 and M4 amplify and output the oscillation signals applied to the second and fourth oscillation nodes N2 and N4. Therefore, the voltage controlled oscillator oscillates at the four oscillation signals having a 90-degree phase difference from each other.

In the voltage controlled oscillator of FIG. 2, the two oscillation nodes N1 and N2 are positioned in the upper side of the transformer T, and the other two oscillation nodes N3 and N4 are positioned in the lower side. Therefore, the four oscillation signals may be generated in such a manner that the four phases thereof have a 90-degree difference from each other. That is, when the first oscillation node N1 has a phase of I+, the second oscillation node N2 has a phase of I−, the third oscillation node N3 has a phase of Q+, and the fourth oscillation node N4 has a phase of Q−.

Therefore, according to the embodiment of the present invention, one transformer T may be used to design the oscillator having quadrature phases, which makes it possible to reduce the occupied area and current consumption. Furthermore, the control voltages $V_{ctrl1}$ and $V_{ctrl2}$ are used to control capacitance in the first to fourth varactor diodes $C_1$ to $C_4$. Therefore, it is possible to control a desired oscillation signal.

In this embodiment of the present invention, the voltage controlled oscillator performs an oscillation operation using a current-reuse structure, in order to minimize the current consumption thereof. The current-reuse structure will be described in detail as follows.

Figure 3:
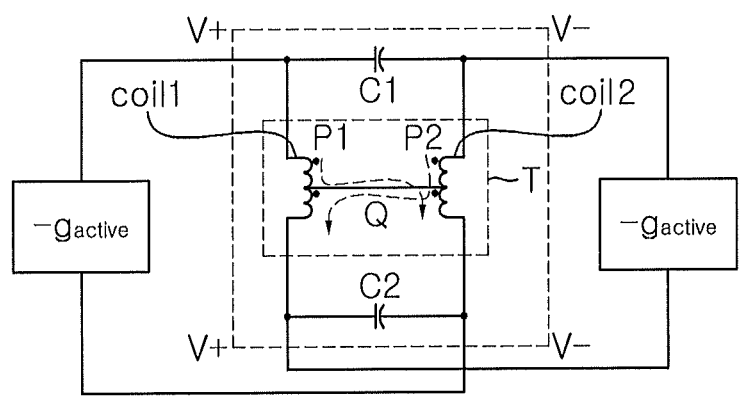
FIG. 3 is a diagram explaining a current-reuse structure of the voltage controlled oscillator illustrated in FIG. 2.

FIG. 3 is a diagram explaining the current-reuse structure of the voltage controlled oscillator illustrated in FIG. 2. In FIG. 3, $-g_{active}$ represents the sum $[(-g_n)+(-g_p)]$ of negative transconductances obtained by connecting the first and second transistors M1 and M2 to the third and fourth transistors M3 and M4 in series.

Referring to FIG. 3, the voltage controlled oscillator according to the embodiment of the present invention includes a first current path P1 directed from the primary coil coil1 via the center tap Q to the secondary coil coil2 and a second current path P2 directed from the second coil coil2 via the center tap Q to the primary coil coil1, depending on the switching operations of the first and second transistors M1 and M2 and the third and fourth transistors M3 and M4.

That is, the first and second transistors M1 and M2 and the third and fourth transistors M3 and M4 are connected in series to form a single current path. Such a current-reuse structure makes it possible to reduce current consumption by half while the oscillation is performed.

Since the primary and secondary coils coil1 and coil2 of the transformer T1 are connected via the center tap Q, the I/Q output levels maybe controlled to remain at the same level, even when the first and second transistors M1 and M2 are not precisely symmetrical with the third and fourth transistors M3 and M4. Furthermore, AC signals of the first and second current paths P1 and P2 are coupled so as to improve a quality factor and a phase noise characteristic.

Figure 4:
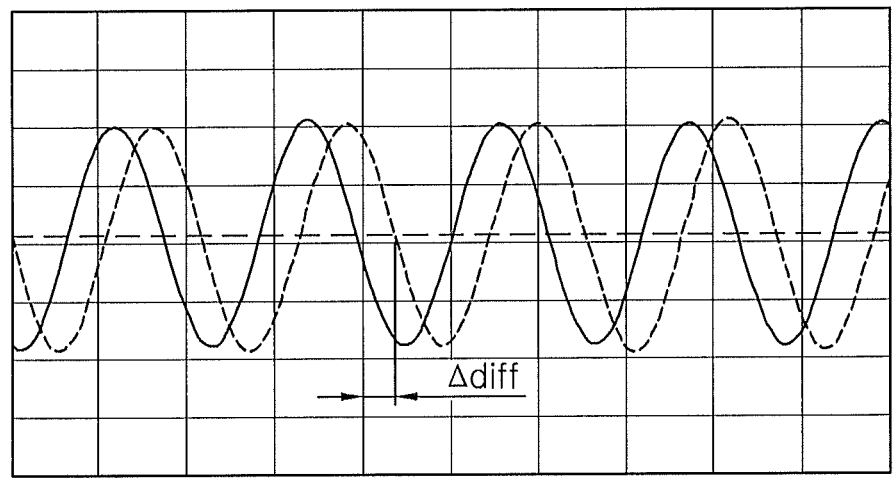
FIG. 4 is a graph showing a result obtained by implementing the circuit of FIG. 2 using CMOS technology.

FIG. 4 is a graph showing a result obtained by implementing the circuit of FIG. 2 using CMOS technology.

In FIG. 4, a solid line indicates a result obtained by measuring the output of the first oscillation node N1, and a dotted line indicates a result obtained by measuring the output of the fourth oscillation node N4. Referring to FIG. 4, it can be seen that the in-phase (I) signal which is the output of the first oscillation node N1 has a 90-degree phase difference from the quadrature (Q) signal which is the output of the fourth oscillation node N4.

When the circuit is implemented with chips, it is difficult to obtain outputs from four oscillations nodes, and outputs are observed only in two oscillation nodes. The signal magnitudes of the respective oscillation nodes have a slight difference from each other, but do not have a large difference.

Figure 5:
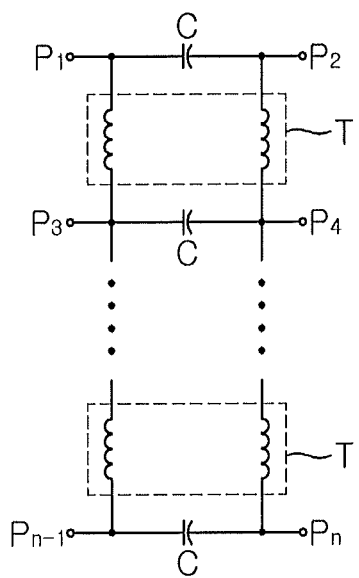
FIG. 5 is a conceptual diagram of a voltage controlled oscillator according to a second embodiment of the present invention.

FIG. 5 is a conceptual diagram of a voltage controlled oscillator according to a second embodiment of the present invention.

Referring to FIG. 5, the voltage controlled oscillator according to the second embodiment of the present invention may include a plurality of transformers T connected in parallel so as to increase the number of oscillation nodes.

When n oscillation phases (where n is a multiple of 2 which is equal to or greater than 6) are to be obtained, (n/2−1) transformers T and (n/2) varactor diodes C are required. The phase of each oscillation node of the voltage controlled oscillator configured in such a manner becomes 2p/n.

That is, according to the second embodiment of the present invention, the transformers T and the varactor diodes C may be connected to form multi-phase oscillation nodes $P_1$, $P_2$, ..., $P_n$, in order to obtain a desired number of phases.

Figure 6:
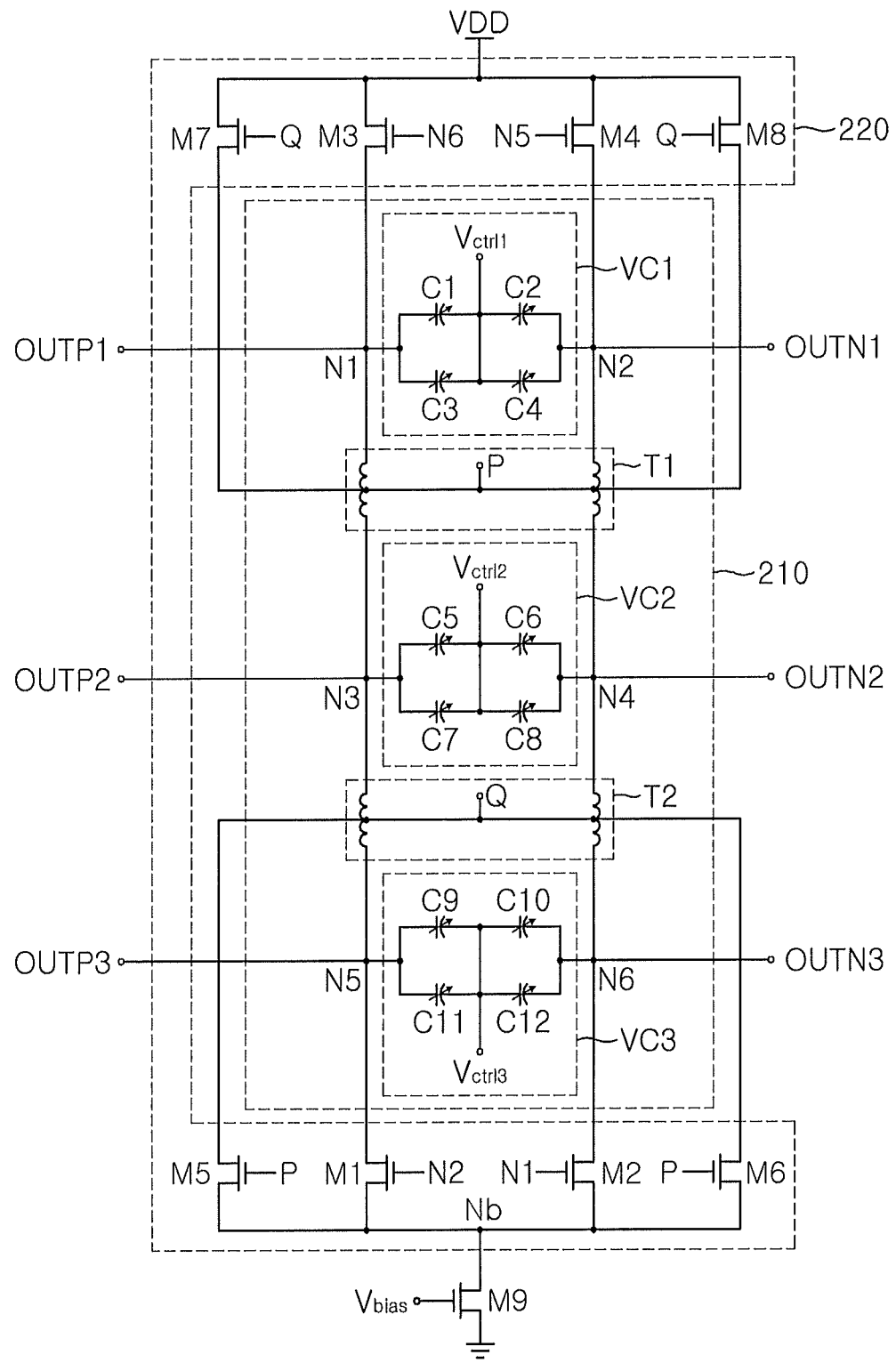
FIG. 6 is a diagram illustrating the voltage controlled oscillator according to the second embodiment of the present invention.

FIG. 6 is a diagram illustrating the voltage controlled oscillator according to the second embodiment of the present invention. FIG. 6 illustrates a case in which the voltage controlled oscillator has six phases, for convenience of description.

Referring to FIG. 6, the voltage controlled oscillator according to the second embodiment of the present invention includes a resonant circuit 210 and a negative resistance circuit 220. The resonant circuit 210 includes two transformers T1 and T2 connected in parallel and three variable capacitors VC1 to VC3 connected in parallel to the two transformers T, and generates six oscillation signals to output to six oscillation nodes N1 to N6. The negative resistance circuit 220 includes eight transistors M1 to M8 cross-coupled via the two transformers T1 and T2 and generates negative resistance for maintaining the oscillation of the six oscillation signals. The voltage controlled oscillator configured in such a manner oscillates at the six oscillation signals having a 60-degree phase difference.

The connection relationship between the respective components will be described in more detail as follows.

Between the two transformers, the transformer T1 includes a primary coil connected to the first and third oscillation nodes N1 and N3 and a secondary coil connected to the second and fourth oscillation nodes N2 and N4, and the transformer T2 includes a primary coil connected to third and fifth oscillation nodes N3 and N5 and a secondary coil connected to the fourth and sixth oscillation nodes N4 and N6. At this time, the center taps P of the primary and secondary coils of the transformer T1 are connected to each other to perform DC bias setting and AC signal coupling, and the center taps Q of the primary and secondary coils of the transformer T2 are connected to each other to perform DC bias setting and AC signal coupling.

The first variable capacitor circuit VC1 includes first to fourth varactor diodes C1 to C4 connected between the first oscillation node N1 and a first control voltage $V_{ctrl1}$ and between the first control voltage $V_{ctrl1}$ and the second oscillation node N2, respectively. The second variable capacitor circuit VC2 includes fifth to eighth varactor diodes C5 to C8 connected between the third oscillation node N3 and a second control voltage $V_{ctrl2}$ and between the second control voltage $V_{ctrl2}$ and the fourth oscillation node N4, respectively. The third variable capacitor circuit VC3 includes ninth to twelfth varactor diodes C9 to C12 connected between the fifth oscillation node N5 and a third control voltage $V_{ctrl3}$ and between the third control voltage $V_{ctrl3}$ and the sixth oscillation node N6, respectively. At this time, the varactor diodes C1 to C12 of FIG. 6 vary their capacitances according to the corresponding control voltages $V_{ctrl1}$ and $V_{ctrl3}$ to vary the oscillation signals.

The negative resistance circuit 220 includes first to fourth transistors M1 to M4. The first transistor M1 is connected between one end N5 of the primary coil of the second transformer T2 and a bias current input node Nb and turned on or off in response to a signal applied to one end N2 of the secondary coil of the first transformer T1. The second transistor M2 is connected between one end N6 of the secondary coil of the transformer T2 and the bias current input node Nb and turned on or off in response to a signal applied to one end N1 of the primary coil of the first transformer T1. The third transistor M3 is connected between a power supply voltage input node VDD and the one end N1 of the primary coil of the first transformer T1 and turned on or off in response to a signal applied to the one end N6 of the secondary coil of the second transformer T2. The fourth transistor M4 is connected between the power supply voltage input node VDD and the one end N2 of the secondary coil of the first transformer T1 and turned on or off in response to a signal applied to the one end N5 of the primary coil of the second transformer T2. That is, the first and second transistors M1 and M2 and the third and fourth transistors M3 and M4 are cross-coupled via the first and second transformers T1 and T2 to thereby generate negative resistance for maintaining the oscillation of oscillation signals applied to the first, second, fifth, and sixth oscillation nodes N1, N2, N5, and N6.

In order to additionally obtain negative resistance for the added transformer, the negative resistance circuit 220 may further include fifth and sixth transistors M5 and M6, which are connected between the center tap Q of the second transformer T2 and the bias current input node Nb and turned on or off in response to a signal applied to the center tap P of the first transformer T1, and seventh and eighth transistors M7 and M8 which are connected between the power supply voltage input node VDD and the center tap P of the first transformer T1 and turned on or off in response to a signal applied to the center tap Q of the second transformer T2. That is, the fifth to eighth transistors M5 to M8 are cross-coupled via the center taps Q and P of the first and second transformers T1 and T2 to additionally generate negative resistance for maintaining the oscillation of oscillation signals applied to the third and fourth oscillation nodes N3 and N4.

The bias current applied to the bias current input node Nb may be generated by a ninth transistor M9 having a drain commonly-connected to the sources of the first, second, fifth, and sixth transistors M1, M2, M5, and M6, a gate receiving a bias voltage $V_{bias}$, and a source connected to a ground terminal.

The voltage controlled oscillator configured in such a manner varies the first to third control voltages $V_{ctrl1}$ to $V_{ctrl3}$ applied to the first to third variable capacitor circuits VC1 to VC3, respectively, to vary the capacitances of the first to twelfth varactor diodes C1 to C12. Then, the first and second transformers T1 and T2 perform a resonant operation with the first to twelfth varactor diodes C1 to C12 having the varied capacitances and generate six oscillation signals having a 60-degree phase difference to output to the first to sixth oscillation nodes N1 to N6.

The voltage controlled oscillator of FIG. 6, including an added number of transformers, may implement the oscillation signals in multiple phases.

Figure 7:
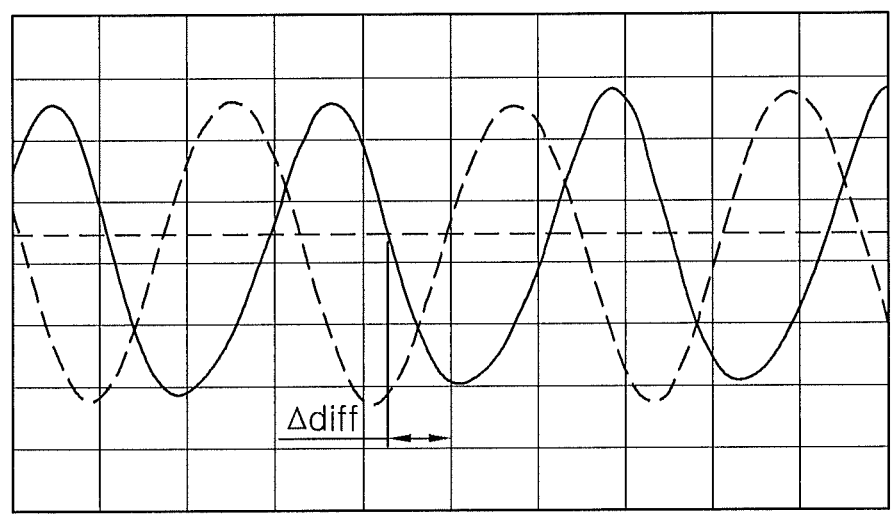
FIG. 7 is a graph showing a result obtained by implementing the circuit of FIG. 6 using CMOS technology.

FIG. 7 is a graph showing a result obtained by implementing the circuit of FIG. 6 using CMOS technology. FIG. 7 shows oscillation waveforms which are measured after implementing a circuit obtained by removing the fifth to eighth transistors M5 to M8 and the output nodes connected to the third and fifth oscillation nodes N3 and N4 from the circuit of FIG. 6.

In FIG. 7, a solid line indicates a result obtained by measuring the output of the first oscillation node N1, and a dotted line indicates a result obtained by measuring the output of the six oscillation node N6. Referring to FIG. 7, it can be seen that the in-phase (I) signal which is the output of the first oscillation node N1 has a 90-degree phase difference from the quadrature (Q) signal which is the output of the sixth oscillation node N6.

Figure 8:
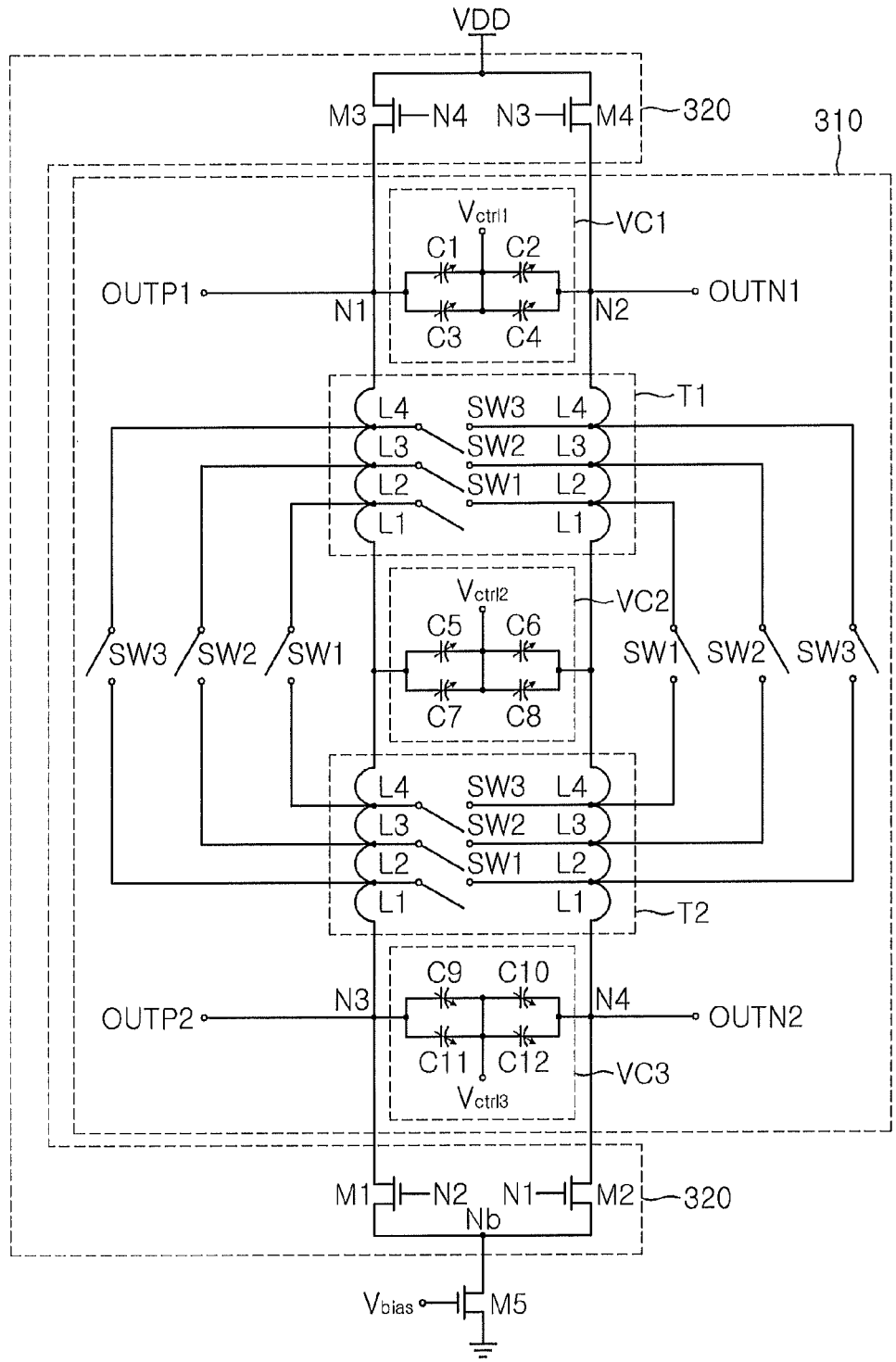
FIG. 8 is a diagram illustrating a voltage controlled oscillator according to a third embodiment of the present invention.

FIG. 8 is a diagram illustrating a voltage controlled oscillator according to a third embodiment of the present invention.

Referring to FIG. 8, the voltage controlled oscillator 300 according to the third embodiment of the present invention includes a resonant circuit 310 configured in a similar manner to the resonant circuit of FIG. 5. However, the resonant circuit 310 includes transformer T1 and T2 having a plurality of center taps and divided into a plurality of inductors L1 to L4. The respective inductors are connected through switches SW1 to SW3.

More specifically, after the first and second transformers T1 and T2 are divided into four inductors, the first inductor L1 inside the same transformer and between different transformers may be connected through the first switch SW1, the second inductor L2 may be connected through the second switch SW2, and the third inductor L3 may be connected through the third switch SW3. In this case, only the first switch SW1 may be turned on to operate the voltage controlled oscillator as a voltage controlled oscillator having two inductances L1 and (L2+L3+L4), only the second switch SW2 may be turned on to operate the voltage controlled oscillator as a voltage controlled oscillator having two inductances (L1+L2) and (L3+L4), or only the third switch SW3 may be turned on to operate the voltage controlled oscillator as a voltage controlled oscillator having two inductances (L1+L2+L3) and L4. Furthermore, the inductances may be varied through other switch combinations.

The voltage controlled oscillator of FIG. 8, having the first to fourth oscillation nodes, may control the frequency oscillation band by controlling the oscillating inductances depending on the switching operations. Therefore, it is possible to implement multiple phases and multiple bands at the same time.

Figure 9:
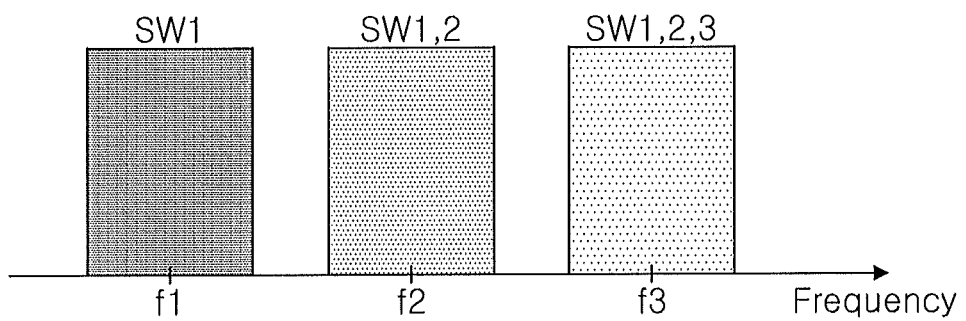
FIG. 9 shows oscillation frequency bands depending on switching operations of the voltage controlled oscillator according to the third embodiment of the present invention.

FIG. 9 shows oscillation frequency bands depending on the switching operations of the voltage controlled oscillator according to the third embodiment of the present invention.

Referring to FIG. 9, it can be seen that as the number of operating switches increases, overall inductance decreases and the oscillation frequency increases.

That is, when only the first switch SW1 is turned on, the oscillation frequency is determined by L1 and (L2+L3+L4). However, when the first and second switches SW1 and SW2 are turned on, the oscillation frequency is determined by L1 and (L3+L4), and when the first to third switches SW1 to SW3 are turned on, the oscillation frequency is determined by L1 and L4. Therefore, the overall inductance decreases, and the oscillation frequency increases.

When a multi-band oscillator using such a structure is designed, a desired oscillation frequency band needs to be first determined to design a transformer accordingly. Since multiple phases are determined by the oscillator structure illustrated in FIG. 5, it is possible to implement a desired multi-phase multi-band oscillator.

According to the embodiments of the present invention, the voltage controlled oscillator may use oscillation signals having multiple phases by using a single transformer. Therefore, it is possible to design a voltage controlled oscillator in which the occupied area and power consumption are reduced. Furthermore, such a structure may be expanded to connect a plurality of transformers in parallel, the number of oscillation phases may increase. Furthermore, switches maybe connected to the center taps of the plurality of transformers to control oscillating inductances. Then, the oscillation frequency band may be changed.

Therefore, the voltage controlled oscillator may generate multi-phase multi-band oscillation signals. Accordingly, it is possible to design a multi-mode multi-band transceiver. Furthermore, the voltage controlled oscillator may be applied to a software defined radio (SDR) structure.

While the present invention has been shown and described in connection with the exemplary embodiments, it will be apparent to those skilled in the art that modifications and variations can be made without departing from the spirit and scope of the invention as defined by the appended claims.

What is claimed is:

1. A voltage controlled oscillator comprising:
a resonant circuit comprising transformers and a plurality of variable capacitor circuits connected in parallel to the transformers and generating a plurality of oscillation signals having multiple phases, wherein each of the transformers comprises primary and secondary coils that have center taps connected to each other, wherein the resonant circuit comprises (n/2−1) transformers (where n is a multiple of 2 which is equal to or greater than 6) and n/2 variable capacitor circuits connected in parallel to the (n/2−1) transformers and generates n oscillation signals having a phase difference of 2π/n from each other; and
a negative resistance circuit comprising a plurality of transistors cross-coupled via the transformers and generating negative resistance for maintaining the oscillation of the resonant circuit.

2. The voltage controlled oscillator of claim 1, wherein each of the variable capacitor circuits comprises one or more varactor diodes in which capacitances are varied by a control voltage.

3. The voltage controlled oscillator of claim 1, wherein the negative resistance circuit comprises:
a first transistor connected between one end of the primary coil of a first transformer among the (n/2−1) transformers and a bias current input node and turned on or off in response to a signal applied to one end of the secondary coil of a second transformer among the (n/2−2) transformers;
a second transistor connected between one end of the secondary coil of the first transformer and the bias current input node and turned on or off in response to a signal applied to one end of the primary coil of the second transformer;
a third transistor connected between a power supply voltage terminal and the one end of the primary coil of the second transformer and turned on or off in response to a signal applied to the one end of the secondary coil of the first transformer; and
a fourth transistor connected between the power supply voltage terminal and the one end of the secondary coil of the second transformer and turned on or off in response to a signal applied to the one end of the primary coil of the first transformer.

4. The voltage controlled oscillator of claim 3, wherein the negative resistance circuit further comprises:
fifth and sixth transistors connected between a center tap of the first transformer, the center tap being connected to the center taps of the primary and secondary coils of the first transformer, and the bias current input node and turned on or off in response to a signal applied to a center tap of the second transformer, the center tap of the second transformer being connected to the center taps of the primary and secondary coils of the second transformer; and seventh and eighth transistors connected between the power supply voltage terminal and the center tap of the second transformer and turned on or off in response to a signal applied to the center tap of the first transformer.

5. The voltage controlled oscillator of claim 3, wherein each of the (n/2−1) transformers comprises a plurality of center taps connected to the first and second primary coils and is divided into a plurality of inductances.

6. The voltage controlled oscillator of claim 5, wherein the resonant circuit further comprises a plurality of switches connecting the center taps of the same transformer and the center taps between different transformers, respectively.

7. A voltage controlled oscillator comprising:

a resonant circuit comprising transformers and a plurality of variable capacitor circuits connected to the transformers and generating a plurality of oscillation signals having multiple phases, wherein the resonant circuit comprises (n/2−1) transformers (where n is a multiple of 2 which is equal to or greater than 6) and n/2 variable capacitor circuits connected in parallel to the (n/2−1) transformers and generates n oscillation signals having a phase difference of $2\pi/n$; and a negative resistance circuit comprising a plurality of transistors cross-coupled via the transformers and generating negative resistance for maintaining the oscillation of the resonant circuit, wherein the plurality of variable capacitor circuits and the transformers are connected to the transistors such that with respect to voltages applied by the transistors to the variable capacitor circuits and the transformers, each of the plurality of variable capacitor circuits is connected in parallel to the transformers, wherein each of the transformers comprises primary and secondary coils that have center taps connected to each other.

8. A voltage controlled oscillator comprising:

a resonant circuit comprising one or more transformers and a plurality of variable capacitor circuits connected in parallel to the one or more transformers and generating a plurality of oscillation signals having multiple phases, wherein each of the transformers comprises switches, a primary coil and a secondary coil, wherein in each transformer taps of the primary coil are connected to taps of the secondary coil through the switches; and a negative resistance circuit comprising a plurality of transistors cross-coupled via the one or more transformers and generating negative resistance for maintaining the oscillation of the resonant circuit.

9. The voltage controlled oscillator of claim 8, wherein the resonant circuit comprises (n/2−1) transformers (where n is a multiple of 2 which is equal to or greater than 6) and n/2 variable capacitor circuits connected in parallel to the (n/2−1) transformers and generates n oscillation signals having a phase difference of $2\pi/n$ from each other.

* * * * *